(12) United States Patent
Takenaka et al.

(10) Patent No.: US 9,039,829 B2
(45) Date of Patent: May 26, 2015

(54) SCALE-SHAPED FILMY FINES DISPERSION

(75) Inventors: Toshio Takenaka, Kyoto (JP); Masato Hirota, Kyoto (JP)

(73) Assignee: Oike & Co., Ltd., Kyoto (JP)

( * ) Notice: Subject to any disclaimer, the term of this patent is extended or adjusted under 35 U.S.C. 154(b) by 486 days.

(21) Appl. No.: 13/392,716

(22) PCT Filed: Aug. 18, 2010

(86) PCT No.: PCT/JP2010/005091
§ 371 (c)(1), (2), (4) Date: Feb. 27, 2012

(87) PCT Pub. No.: WO2011/024407
PCT Pub. Date: Mar. 3, 2011

(65) Prior Publication Data
US 2012/0174824 A1 Jul. 12, 2012

(30) Foreign Application Priority Data
Aug. 31, 2009 (JP) ................................. 2009-199457

(51) Int. Cl.
| | | |
|---|---|---|
| C09D 11/037 | (2014.01) | |
| C09D 11/30 | (2014.01) | |
| C23C 14/20 | (2006.01) | |
| B22F 1/00 | (2006.01) | |
| B22F 9/04 | (2006.01) | |
| C09C 1/62 | (2006.01) | |
| C09D 11/322 | (2014.01) | |
| C23C 14/00 | (2006.01) | |

(52) U.S. Cl.
CPC ............. C23C 14/205 (2013.01); B22F 1/0055 (2013.01); B22F 9/04 (2013.01); B22F 2001/0092 (2013.01); C01P 2004/20 (2013.01); C01P 2004/22 (2013.01); C01P 2004/54 (2013.01); C09C 1/62 (2013.01); C09D 11/322 (2013.01); C23C 14/0005 (2013.01)

(58) Field of Classification Search
CPC ............................... C09D 11/30; C09D 11/322
See application file for complete search history.

(56) References Cited

U.S. PATENT DOCUMENTS

| | | | |
|---|---|---|---|
| 2006/0048676 A1* | 3/2006 | Bujard | ........................... 106/415 |
| 2008/0145628 A1 | 6/2008 | Oyanagi et al. | |
| 2008/0182083 A1 | 7/2008 | Oyanagi et al. | |
| 2008/0182085 A1 | 7/2008 | Oyanagi et al. | |
| 2008/0213518 A1 | 9/2008 | Oyanagi et al. | |
| 2009/0075036 A1 | 3/2009 | Itano et al. | |
| 2009/0214833 A1 | 8/2009 | Oyanagi et al. | |
| 2010/0009136 A1 | 1/2010 | Oyanagi et al. | |

FOREIGN PATENT DOCUMENTS

| | | |
|---|---|---|
| CN | 101235237 | 8/2008 |
| JP | 11-323223 | 11/1999 |
| JP | 11-343436 | 12/1999 |
| JP | 2003-026956 | 1/2003 |
| JP | 2007-131741 | 5/2007 |
| JP | 2008-174712 | 7/2008 |
| JP | 2008-202076 | 9/2008 |
| JP | 2008-208330 | 9/2008 |
| JP | 2008-208332 | 9/2008 |
| JP | 2008-239951 | 10/2008 |
| JP | 2009-256565 | 11/2009 |
| JP | 2010-018651 | 1/2010 |
| JP | 2010-168411 | 8/2010 |
| JP | 2010-168412 | 8/2010 |
| WO | WO-2006/101054 | 9/2006 |
| WO | WO-2008/077612 | 7/2008 |

OTHER PUBLICATIONS

Chinese Office Action issued Jun. 23, 2014 corresponding to Chinese Patent Application No. 201080037562.3.
Chinese Office Action issued Nov. 4, 2014 corresponding to Chinese Patent Application No. 201080037562.3.

* cited by examiner

*Primary Examiner* — Pegah Parvini
(74) *Attorney, Agent, or Firm* — Jordan and Hamburg LLP

(57) ABSTRACT

Provided is a scale-shaped filmy fines dispersion. More specifically, scale-shaped filmy fines are subjected to a treatment for keeping the scale-shaped filmy fines from easily settling out. In the case of a metallic pigment using the scale-shaped filmy fines, the scale-shaped filmy fines are dispersed in the ink. As a result, nozzle clogging can be prevented, and the obtained print can achieve abundant metallic luster. The scale-shaped filmy fines dispersion contains, in a solvent, scale-shaped filmy fines obtained by finely grinding a simple metal, an alloy, or a metal compound. The scale-shaped filmy fines have a mean length of 0.5 μm or more and 5.0 μm or less, a maximum length of 10 μm or less, a mean thickness of 5 nm or more and 100 nm or less, and an aspect ratio of 20 or more.

16 Claims, No Drawings

SCALE-SHAPED FILMY FINES DISPERSION

BACKGROUND OF THE INVENTION

The present invention relates to a scale-shaped filmy fines dispersion. Specifically, for example, the present invention relates to a dispersion containing scaled-shaped and filmy fines of metal such as aluminum in a solvent, which is used as a raw material for a metallic pigment ink for an ink-jet printer, and allows a print exhibiting metallic luster to be achieved by an ink-jet printer.

Conventionally, outdoor advertisements are approaches that have been widely used for such as advertisements of goods and stores. Above all, the approach of developing advertisements using prints has been carried out widely. Posting posters on various places has been most commonly carried out as this outdoor advertisement using prints. This type of outdoor advertisement using posters is an approach seen universally on the street even now. In addition, recently, with improvement in printing technique, even giant-size prints (for example, signboards conventionally drawn by hand) have been used as outdoor advertisements. More specifically, printing is carried out on special paper and the like, and the paper is attached to a board for outdoor display.

The production of these prints, that is, posters, outdoor advertisements, sign displays, POP advertising (Point of purchase advertising), etc. is created in companies, etc. for producing signboards and sign displays, besides various types of printing companies. Furthermore, the production of such prints is also carried out in photographic laboratories, commercial printing companies, etc. However, in recent years, changes in circumstances have been caused, such as a reduction in lot size, quicker delivery, and diversity and complexity in graphical designs. In order to respond to such changes in circumstances, the digitalization of the print creation has been progressed rapidly. In addition, at the same time, a rapid expansion of the market has been observed.

With such changes in circumstances, the differentiation of prints has been demanded strongly. For example, more highly detailed prints have been demanded than contents expressed by normal printing. In addition, prints with details smoothly expressed as much as possible have been demanded. Furthermore, in the case of photographic printing, prints that recreate precision equivalent to that of photographic printing by conventional silver halide photography even to details have been demanded. Therefore, printing capable of such expressions has been demanded. Then, in order to respond to the various requests described above, ink-jet printers for business purposes (hereinafter, simply referred to as "ink-jet printers") have been often used nowadays.

Moreover, at the same time as the request for highly detailed printing, the demand on printing for exhibiting a high-quality appearance has been also increased. As the best example, the use of metallic luster has been demanded.

Conventionally, transfer foils, so-called gold foils and silver foils, have been widely used for providing the metallic luster in prints. However, situations requiring highly detailed printing as described above are not satisfied by only using the transfer. Therefore, the use of an ink with metallic luster, or an ink using a metallic pigment (hereinafter, also simply referred to as a "metallic pigment ink"), has been demanded for printing. Above all, in ink-jet printers that allow highly detailed printing, demands for using the metallic pigment ink have been increased.

In order to obtain prints exhibiting this metallic luster like a gold or silver foil, the simplest way for printing with a profound effect is printing with a metallic pigment ink prepared from fine pieces of metal with a gold or silver color.

Further, examples of such a metallic pigment ink include inks for ink-jet printers proposed in Patent Document 1 and Patent Document 2. These inks are supposed to be used for ink-jet printers, and more specifically, these inks contain flattened pieces of aluminum, gold, silver, or the like of 0.2 μm in thickness.

PRIOR ART DOCUMENTS

Patent Documents

Patent Document 1: Japanese Patent Application Laid-Open No. 11-323223
Patent Document 2: Japanese Patent Application Laid-Open No. 11-343436

However, the ink-jet ink described in Patent Document 1 is an ink with atypical flattened metal pieces (hereinafter, also simply referred to as "flattened pieces") simply mixed therein. Therefore, the use of this ink for ink-jet printers for business purposes even fails to achieve highly lustrous prints, for the reason of the shape of the flattened pieces. For flattened pieces contained in the ink-jet ink described in Patent Document 2, a resin layer is further stacked on the ink-jet ink flattened pieces described in Patent Document 1. Therefore, printing with this ink fails to achieve highly lustrous prints, because of the thickness of the flattened pieces.

This matter will be described below.

First, in the case of simply mixing flattened pieces into an ink to obtain a metallic pigment ink, the flattened pieces will settle out in the bottom of the ink tank before a lapse of long time, unless any sort of measures are implemented. When the metallic pigment ink with the flattened pieces settled is used for ink-jet printers, only a sort of supernatant ink with no flattened pieces mixed therein is discharged from the ink tank through an ink nozzle section (hereinafter, also simply referred to as a "nozzle") of the ink-jet printer. As a result, the obtained print is a simple ordinary print. More specifically, the print makes the use of the metallic pigment ink meaningless, without any metallic luster even in a printed section desiring metallic luster. Furthermore, if the use of the ink-jet printer is continued as it is, the settled flattened pieces of the metallic pigment ink will be used eventually. However, in this case, the metallic ink containing a large amount of flattened pieces is guided intensively into the nozzle section at once from the ink tank. In addition, when the ink is discharged from the nozzle, the nozzle section is easily blocked by the flattened pieces. As a result, printing trouble is caused to lead to a failure of printing to be carried out.

The reason of this phenomenon caused is as follows: Even if the actual size of each flattened piece is not enough to block the nozzle, the phenomenon of the flattened pieces agglomerated with each other for various reasons may be caused in some cases. In addition, such a phenomenon is likely to be caused actually. Therefore, the metallic pigment ink simply containing therein the flattened pieces is not able to be put into practical use. In order to make the metallic pigment ink available actually, there is a need to exercise ingenuity with certainty, such as, for example, the flattened pieces subjected to some sort of treatment. Otherwise, the metallic pigment ink fails to produce any effect actually.

In other words, the ink simply containing the flattened pieces is hardly used as an ink for a ink-jet printer. Furthermore, a metallic pigment ink containing further ground flattened pieces will cause the flattened pieces to settle out or agglomerate in the ink tank in actual use. As a result, the use as a metallic pigment ink is not possible.

Thus, in order to prevent this phenomenon, it is conceivable that the metallic pigment ink containing the flattened pieces is sufficiently agitated before actual use to make the flattened pieces present uniformly in the metallic pigment ink. However, the device needs some sort of ingenuity exercised separately. As a result, it is expected that problems will be caused, such as a limit imposed on the device which can use the metallic pigment ink.

In addition, even if it is possible to discharge the flattened pieces from a nozzle of an ink-jet printer by some sort of approach, it is difficult to achieve beautiful metallic luster in the case of the ink described in Patent Document 1. This is because most of the flattened pieces contained in the ink are conceivable to be substantially granular in shape. More specifically, even when the substantially granular flattened pieces arranged in a planar form are irradiated with a ray of light, the ray of light is diffusely reflected. As a result, it is conceivable that desired metallic luster will not be achieved.

More specifically, when the flattened pieces are substantially granular in shape, the detailed observation of a printing surface obtained by applying the flattened pieces onto a flat surface finds that there are a countless number of irregularities. Therefore, even light incident onto this surface will be diffusely reflected. As a result, the printing surface fails to achieve a sufficient degree of luster. Thus, in order to achieve a degree of luster with the use of the flattened pieces, the flattened pieces preferably have a flattened shape with an aspect ratio high as much as possible. It is noted that the aspect ratio herein refers to a value obtained from the mean length/mean thickness of the flattened pieces. Further, the mean length of the flattened pieces refers to a mean value of all the flattened pieces in terms of the value of the maximum length among the lengths of one flattened piece from end to end in the case of a substantially planar view of the flattened piece. In addition, the mean thickness of the flattened pieces refers to a mean value for all the flattened pieces in terms of the thickness of one flattened piece in the case of a substantially side view of the flattened piece. Hereinafter, the same applied to these meanings. Further, the higher the aspect ratio of the flattened piece, the more the shape of the flattened piece can be flattened.

Further, in the case of the atypical flattened pieces described in Patent Document 1 and Patent Document 2, a printing surface obtained by applying the pieces onto a flat surface has small numbers of irregularities as compared with the case of the granular shape. Therefore, the degree of metallic luster may be increased at the printing surface. However, in the case of the aspect ratio of less than 20, the degree of flatness is insufficient. In addition, even if a metallic pigment ink using such pieces is printed actually, sufficient metallic luster will not be achieved.

Further, the atypical flattened pieces described in Patent Document 1 and Patent Document 2 cause fine irregularities at the surfaces for the reason described previously, even in the case of the aspect ratio of 20 or more actually. Therefore, there is a problem that even if a metallic pigment ink using such atypical flattened pieces is printed, a high degree of metallic luster will not be achieved.

The present invention has been achieved in view of these problems, and an object of the present invention is to provide a scale-shaped filmy fines dispersion that can be used for a metallic pigment ink. More specifically, scale-shaped filmy fines are subjected to a treatment for keeping the scale-shaped filmy fines from easily settling out in a metallic pigment ink. The preparation of a metallic pigment with the use of such fines achieves an ink with the scale-shaped filmy fines dispersed in a more substantially uniform manner, as compared with conventional cases. As a result, the use of the ink as a metallic pigment ink can prevent nozzle clogging. In addition, the obtained print can exhibit abundant metallic luster.

SUMMARY OF THE INVENTION

In order to solve the problems mentioned above, the present invention comprises a scale-shaped filmy fines dispersion to be used in a metallic pigment ink for an ink-jet printer, which includes, in a solvent, scale-shaped filmy fines obtained by finely grinding a simple metal, an alloy, or a metal compound, wherein: when one scale-shaped filmy fine among the scale-shaped filmy fines is observed in a substantially planar view and, with respect to the longest length value among lengths of the scale-shaped filmy fine from end to end, the mean value of the length values of all the scale-shaped filmy fines is regarded as a mean length, the mean length is 0.5 μm or more and 5.0 μm or less; when the maximum among the length values is regarded as a maximum length, the maximum length is 10 μm or less; and when one scale-shaped filmy fine among the scale-shaped filmy fines is observed in a substantially side view and, with respect to the thickness value of the scale-shaped filmy fine, the mean value of the thickness values of all the scale-shaped filmy fines is regarded as a mean thickness, the mean thickness is 5 nm or more and 100 nm or less.

The present invention comprises a scale-shaped filmy fines dispersion to be used in a metallic pigment ink for an ink-jet printer, which includes obtaining through: a laminated body production step of obtaining a laminated body by stacking, on a surface of a polymer resin film as a base material film, a release layer of resin, and a filmy layer obtained by vapor depositing or sputtering any one or more of a simple metal, an alloy, and a metal compound in this order; a filmy layer separation step of obtaining a thin film by separating the filmy layer from the laminated body while using a solvent which is able to dissolve the resin; a fine grinding step of finely grinding the thin film existing in the solvent; and a concentration adjustment step of adjusting the solid content concentration of the finely ground thin film in the solvent after the fine grinding step, wherein: when one scale-shaped filmy fine among the scale-shaped filmy fines is observed in a substantially planar view and, with respect to the longest length value among lengths of the scale-shaped filmy fine from end to end, the mean value of the length values of all the scale-shaped filmy fines is regarded as a mean length, the mean length is 0.5 μm or more and 5.0 μm or less; when the maximum among the length values is regarded as a maximum length, the maximum length is 10 μm or less; and when one scale-shaped filmy fine among the scale-shaped filmy fines is observed in a substantially side view and, with respect to the thickness value of the scale-shaped filmy fine, the mean value of the thickness values of all the scale-shaped filmy fines is regarded as a mean thickness, the mean thickness is 5 nm or more and 100 nm or less.

The present invention comprises the aforesaid scale-shaped filmy fines dispersion, wherein the scale-shaped filmy fines have an aspect ratio of 20 or more, the aspect ratio represented by the ratio between the mean length and the mean thickness, that is, the mean length/the mean thickness.

The present invention comprises the aforesaid scale-shaped filmy fines dispersion, wherein the scale-shaped filmy fines have an aspect ratio of 40 or more, the aspect ratio represented by the ratio between the mean length and the mean thickness, that is, the mean length/the mean thickness.

The present invention comprises a scale-shaped filmy fines dispersion, wherein a metallic pigment ink for an ink-jet printer, the ink obtained by using the scale-shaped filmy fines dispersion of any one of claims 1 to 4, is printed on a lustrous vinyl chloride sheet, and the metallic luster of a printing surface obtained by the printing is measured in accordance with JIS_Z_8741 standards to provide results of 150 or more for 20° specular gloss and 250 or more for 60° specular gloss.

The present invention comprises a scale-shaped filmy fines dispersion, wherein a metallic pigment ink for an ink-jet printer, the ink obtained by using the scale-shaped filmy fines dispersion, is printed on a lustrous vinyl chloride sheet, and the metallic luster of a printing surface obtained by the printing is measured in accordance with JIS_Z_8741 standards to provide results of 200 or more for 20° specular gloss and 330 or more for 60° specular gloss.

The present invention comprises the aforesaid scale-shaped filmy fines dispersion, wherein the simple metal, alloy, or metal compound is any one or more from the group of metals consisting of aluminum, silver, gold, nickel, chromium, tin, zinc, indium, titanium, silicon, copper, and platinum; or alloys using the group of metals; or any one or more of oxides, nitrides, sulfides, and carbides of the group of metals or alloys thereof.

The present invention comprises the aforesaid scale-shaped filmy fines dispersion, wherein the solvent is an organic solvent.

The present invention comprises the aforesaid scale-shaped filmy fines dispersion, wherein the organic solvent is either a glycol ether-based organic solvent or a lactone-based organic solvent, or both thereof.

The present invention comprises the aforesaid scale-shaped filmy fines dispersion, wherein the content of the resin in the scale-shaped filmy fines dispersion is 5 wt % or less of the scale-shaped filmy fines dispersion.

The present invention comprises the aforesaid scale-shaped filmy fines dispersion, wherein the resin is soluble in the solvent.

The present invention comprises the aforesaid scale-shaped filmy fines dispersion, wherein the resin is any one of cellulose acetate butyrate, polyvinyl alcohol, polyvinyl butyral, polyethylene glycol, polyacrylic acids, polyacrylamide, cellulose derivatives, acrylic acid copolymers and modified nylon resins.

As described above, in the case of the scale-shaped filmy fines dispersion according to the present invention, the mean length, maximum length, thickness, and aspect ratio of the scale-shaped filmy fines particularly contained in the dispersion are set within predetermined ranges. This makes the scale-shaped filmy fines to be easily dispersed in the dispersion in a preferred manner without easily settling out in the solvent, as compared with conventional cases. In addition, the scale-shaped filmy fines have a scale-like shape. The scale-shaped filmy fines are used as a material for a metallic pigment ink for an ink-jet printer. Thus, the printing surface has a higher degree of metallic luster, as compared with a case of applying a conventional metallic pigment ink. In addition, a metallic pigment ink obtained with the use of the scale-shaped filmy fines dispersion according to the present invention will not cause nozzle clogging due to the presence of the scale-shaped filmy fines. Thus, such a metallic pigment ink can be used for conventional ink-jet printers for business purposes. Therefore, the range of printing expression can be extended dramatically.

In addition, in the approach for obtaining the scale-shaped filmy fines dispersion, the filmy layer is separated from the laminated body composed of the base material film/release layer/filmy layer, while using a solvent which is able to dissolve the release layer. This separation provides a dispersion containing, in the solvent, the separated filmy layer as foil. Furthermore, in this case, after finely grinding the foil existing in the solvent, the ratio of the finely ground scale-shaped filmy fines is easily adjusted. More specifically, it is preferred in that the concentration of the scale-shaped filmy fines can be easily adjusted freely. Therefore, the concentration of the scale-shaped filmy fines is preferably easily adjusted to a concentration suitable for an ink-jet ink. Further, the scale-shaped filmy fines in the solvent are easily dispersed in the solvent. Thus, the use of the scale-shaped filmy fines as a raw material for a metallic pigment ink will hardly cause sedimentation or condensation of the scale-shaped filmy fines in the obtained metallic pigment ink. Therefore, the use of this metallic pigment ink for an ink-jet printer allows fair metallic printing to be easily carried out.

Further, as an approach for obtaining the scale-shaped filmy fines dispersion, for example, cellulose acetate butyrate may be used as a release layer. In addition, either glycol ether-based solvent or lactone-based solvent, or mixtures thereof may be used as the solvent. In this case, a dispersion can be obtained in which the scale-shaped filmy fines are less likely to be agglomerated, that is, more likely to be dispersed. Furthermore, the thus obtained dispersion is used as a raw material for a metallic pigment ink. In this case, the obtained metallic pigment ink is used for an ink-jet printer or the like. It allows printing to be carried out to provide prints with higher smoothness and uniform metallic luster, as compared with the conventional cases.

DETAILED DESCRIPTION OF THE PREFERRED EMBODIMENTS

Embodiments of the present invention will be described below. It is noted that the embodiment described herein is an example only, and the present invention is not necessarily to be limited to these embodiments.

Embodiment 1

A scale-shaped filmy fines dispersion (hereinafter, also simply referred to as a "dispersion") will be described in accordance with a first embodiment of the present invention.

The dispersion according to the present embodiment generally refers to a solution with a finely ground thin film present as filmy fines in a solvent. In addition, the filmy fines have a scale shape obtained by finely grinding a thin film. More specifically, as one of features of the dispersion according to the present embodiment, the scale-shaped filmy fines are subjected to a treatment, so as not to be easily settled out or agglomerated in the solvent. Further, another feature of the dispersion according to the present embodiment is also prospectively described as an assumption of use in a metallic pigment ink for an ink-jet printer.

First, the dispersion according to the present embodiment will be described.

The dispersion according to the present embodiment is a scale-shaped filmy fines dispersion to be used in a metallic pigment ink for an ink-jet printer, which includes, in a solvent, a scale-shaped filmy fines obtained by finely grinding a simple metal, an alloy, or a metal compound. This dispersion has the following configuration. More specifically, when one scale-shaped filmy fine is observed in a substantially planar view among the scale-shaped filmy fines, for the longest value among the lengths of the fine from end to end, the mean value of all the scale-shaped filmy fines (that is, mean length) is 0.5

µm or more and 5.0 µm or less. In addition, the maximum of the length (that is, maximum length) is 10 µm or less. Furthermore, when one scale-shaped filmy fine is observed in a substantially side view, for the thickness of the fine, the mean value of all the scale-shaped filmy fines (that is, mean thickness) is 5 nm or more and 100 nm or less.

A description will be given below in order.

First, the scale-shaped filmy fines will be described.

The scale-shaped filmy fines refer to a finely ground simple metal, alloy, or metal compound in the present embodiment. More specifically, the scale-shaped filmy fines may be of any one or more from a group of simple metals consisting of aluminum, silver, gold, nickel, chromium, tin, zinc, indium, titanium, silicon, copper, and platinum. Alternatively, the scale-shaped filmy fines may be alloys obtained by combining these metals in the group. Alternatively, the scale-shaped filmy fines may be obtained by finely grinding any one or more of oxides, nitrides, sulfides, and carbides from the individual metals or alloys thereof in the group.

The scale-shaped filmy fines may be, for example, a finely ground aluminum element. The scale-shaped filmy fines may be a mixture of an aluminum element and a silver element which are each finely ground. Furthermore, the scale-shaped filmy fines may be a finely ground alloy using aluminum, or a finely ground aluminum oxide. In any case, the scale-shaped filmy fines are used in order to obtain metallic luster in the present embodiment. In that regard, the material for the scale-shaped filmy fines may be selected depending on what metallic luster is desired. Thus, aluminum is to be used as the material for the scale-shaped filmy fines in the present embodiment. Accordingly, the scale-shaped fines are regarded as scale-shaped aluminum fines in the following description. In addition, in the following description, the dispersion refers to scale-shaped fines of aluminum dispersed and contained in a solvent (hereinafter, the scale-shaped aluminum fines are also simply referred to as "aluminum fines" in the present embodiment).

The mean thickness and mean length of the shapes of the scale-shaped filmy fines are important to the metallic luster in the case of applying a metallic pigment ink using the fines.

The scale-shaped filmy fines according to the present embodiment literally have a scale-shaped appearance. More specifically, the individual fines are very finely powdered. The individuals picked up and observed have a scale-shaped appearance. When each scale-shaped fine is observed, obviously, it has completely different lengths from end to end in a substantially planar view. Thus, among the lengths of each fine, the longest one is defined. Then, the mean value of the maximum lengths of the respective scale-shaped fines, or the mean value of the lengths from end to end, is regarded as the mean length. This mean length is 0.5 µm or more and 5.0 µm or less in the case of the scale-shaped filmy fines according to the present embodiment. In addition, the longest one among the lengths, that is, the maximum length is preferably 10 µm or less.

In addition, these scale-shaped metal fines are also naturally different in thickness from individual to individual in a substantially side view. In addition, even simple metal fines fail to have any completely uniform thickness if the fines are magnified and observed. However, the mean thickness obtained by averaging the individual thicknesses is preferably 5 nm or more and 100 nm or less in the present embodiment.

Furthermore, when the aspect ratio (that is, mean length/mean thickness) of the scale-shaped filmy fines is 20 or more, more preferably 40 or more, it means that the scale-shaped filmy fines have a flattened shape preferred in the present embodiment. This aspect will be separately described later.

Now, the mean length will be described. When the mean length is increased over 5.0 µm, the scale-shaped aluminum fines will be precipitated in an organic solvent in a short period of time in the case of using the fines as a raw material for a metallic pigment ink for ink-jet printers, which will be described later. As a result, it is difficult in coating to obtain a metallic pigment ink containing uniform scale-shaped aluminum fines. From this point of view, the mean length more preferably has an upper limit of 1.5 µm, in order to keep the scale-shaped aluminum fines dispersed in a further preferable manner. In addition, in the case of the mean length below 0.5 µm, it is difficult to definitely achieve the after-mentioned luster at the time of printing because of the too much fineness. Therefore, the scale-shaped aluminum fines desirably have a mean length of 0.5 µm or more. In addition, in that case, the scale-shaped aluminum fines desirably have a maximum length of 10 µm or less. This is because the present inventors have found that even when the scale-shaped aluminum fines have a mean length of less than 5.0 µm, there is a possibility of trouble caused at the time of printing if there are mixed fines with a length over 10 µm. More preferably, the scale-shaped aluminum fines have a maximum length of 5.0 µm or less. This is because the present inventors have found that when the scale-shaped aluminum fines have a maximum length of less than 5.0 µm, any trouble is not likely to be caused at the time of printing. Of course, when the scale-shaped aluminum fines have a maximum length of 5.0 µm or less, the mean length of the fines in that case will fall below 5.0 µm. It is noted that the mean length and maximum length of the scale-shaped aluminum fines may be measured with the use of a common measuring apparatus, for example, a light scattering particle size distribution measuring apparatus.

Next, the mean thickness of the scale-shaped filmy fines will be described. The present inventors have found the following. More specifically, when the scale-shaped filmy fines have a mean thickness of more than 100 nm, there may be fines overlapped with each other in some cases in the case of applying a paint using the scale-shaped filmy fines as described above. In this case, unnecessary spaces will be produced widely between the scale-shaped filmy fines. As a result, the coated surface has irregularities produced, and the coated surface thus fails to provide a smooth surface. Therefore, the surface fails to achieve effective metallic luster. In other words, the scale-shaped filmy fines according to the present embodiment have a mean thickness of 100 nm or less, and thus effective metallic luster is achieved. In addition, in order to provide a further smooth surface, the mean thickness is preferably made 30 nm or less. However, the thickness of less than 5 nm means that scale-shaped filmy fines themselves are thin considerably. Therefore, the scale-shaped filmy fines are too small in thickness to achieve metallic luster which is originally supposed to be achieved. Accordingly, the scale-shaped filmy fines are adjusted to 5 nm in thickness in the present embodiment.

As described above, the mean length, maximum length, mean thickness, and aspect ratio for the scale-shaped filmy fines are respectively defined in predetermined numerical ranges in the present embodiment. This definition achieves scale-shaped filmy fines of appropriate size, which are not small more than necessary or large more than necessary. In other words, when the scale-shaped filmy fines are too small, the scale-shaped filmy fines will be agglomerated with each other. As a result, large agglomerates are generated in a metallic pigment ink. Therefore, the agglomerated scale-shaped filmy fines are precipitated. Thus, when the scale-shaped filmy fines are unevenly distributed, the metallic pigment ink is not suitable for actual use. In addition, the large scale-shaped filmy fines cause the phenomenon of nozzle clogging. Therefore, as a result of earnest research, the present inventors have defined the ranges as described above in order to prevent the scale-shaped filmy fines from being small or large in size more than necessary, in the sense of no agglomeration for precipitation, and no nozzle clogging caused.

Further, the mean length and mean thickness of the metal fines were obtained by the following method.

First, the 50% mean particle size (median size) obtained with the use of a laser diffraction/scattering particle size distribution measuring apparatus is regarded as the mean length. Further, it is noted that the average particle size in the present invention is supposed to be measured with the use of the "LMS-30" manufactured by Seishin Enterprise Co., Ltd.

In addition, the mean thickness was obtained as follows. That is, in a lamination approach to be used in the production of the dispersion according to the present embodiment described later, the thickness at the lamination point as an origin of the scale-shaped filmy fines is directly regarded as the thickness of the scale-shaped filmy fines. In the measurement of the thickness, an X-ray fluorescence spectrometer was used. Furthermore, the measurement was made for more than one lamination point, and the mean value of the obtained values is regarded as the mean thickness.

Thus, in summary, the shape and various numerical ranges for the scale-shaped aluminum fines in the present embodiment are defined as described above. The scale-shaped aluminum fines are used to prepare a metallic pigment ink. When this ink is used to carry out printing with an ink-jet printer, the following advantages are provided.

First, the printing surface exhibits favorable metallic luster. This is because the scale-shaped filmy fines are used. As described previously, the fines contained in a conventional metallic ink for exhibiting metallic luster are substantially granular. However, when the fines arranged in a planar form are observed from the side, the surface has random irregularities. More specifically, as long as the surface has random irregularities, even a ray of light incident on the surface will be diffusely reflected. As a result, it is difficult to achieve desired metallic luster. However, the scale-shaped filmy fines are used in the present embodiment. Therefore, when the scale-shaped filmy fines arranged in a planar form are observed from the side, the surface is more planar, as compared with the case of conventional substantially granular fines. More specifically, the surface is relatively smooth. Therefore, when a ray of light is incident on the surface, the incident light is reflected in substantially the same direction. As a result, the printing surface can exhibit favorable metallic luster.

In addition, the respective numerical ranges of the mean length, maximum length, mean thickness, and aspect ratio are defined as mentioned above to use the dispersion according to the present embodiment as a raw material for a metallic pigment ink. When the ink is used for an ink-jet printer, nozzle clogging can be prevented from being caused. In other words, the present inventors have found that the following conditions can be met by defining the mean length, the maximum length, the mean thickness, and the aspect ratio as mentioned above. More specifically, some models of ink-jet printers for business purposes are also provided which allow highly detailed drawings. However, in the case of the printers which can produce such highly detailed drawings, nozzles as ink discharge sections are very small in size. More specifically, it is obvious that the scale-shaped filmy fines naturally have to be smaller in size than the holes of the nozzles, for discharging the scale-shaped filmy fines from the small nozzle holes.

On the other hand, when the scale-shaped filmy fines are excessively small, there is a possibility that the scale-shaped aluminum fines will be agglomerated. The present inventors have found that the fines need to be to some extent large for preventing the agglomeration. In addition, as a result of various investigations, the present inventors have found that the application of the numerical ranges mentioned above is preferred.

Thus, in this way, the dispersion containing the scale-shaped aluminum fines is used for a metallic pigment ink. The use of the dispersion according to the present embodiment causes a printing surface with the metallic pigment ink printed thereon to exhibit great metallic luster, as compared with conventional inks. Now, this aspect will be described.

First, the metallic luster in the present embodiment will be described.

The metallic luster of a printing surface obtained by printing the metallic pigment ink on a lustrous vinyl chloride sheet can be measured based on the JIS_Z_8741 standards. Incidentally, in the case of using a conventionally distributed typical pigment ink which exhibits a metallic color, the measurement values are on the order of about 80 for 20° specular gloss and on the order of about 100 for 60° specular gloss. In addition, the metallic luster is considered higher as these values are higher.

An object of obtaining the dispersion in the present embodiment is to increase this specular gloss. In general, in order to improve the metallic luster, the surface of a printing surface with a printed pigment ink thereon which exhibits a metallic color may be observed at a magnification, and adapted to be further smoother. More specifically, when the surface is a rough surface with irregularities, a ray of light incident on the rough surface will be diffusely reflected. As a result, the observer is not able to visually recognize rays of reflected light from the surface. More specifically, the observer will visually recognize the surface as a printing surface with a low degree of luster. On the other hand, when the surface is very smooth, a ray of light incident on the smooth surface will not be diffusely reflected. Incident rays of light will be reflected together in the same direction. Therefore, the observer can visually recognize the reflected rays of light. More specifically, the observer will visually recognize the surface as a printing surface with a high degree of luster.

Thus, the dispersion in the present embodiment will be investigated. Depending on the shape of the aluminum fines contained in this dispersion, a large difference is expected to be produced in the surface state. More specifically, the application of the metallic pigment ink produces a state as if the aluminum fines contained in the ink were applied and stacked. In this case, if the shapes of the aluminum fines are individually, for example, granular, a large number of granular substances stacked will finally result in severe surface irregularities. On the other hand, if the aluminum fines have a flattened scale shape, the fines will be merely stacked as if the fines were a plate-like substance. Therefore, the surface can be achieved which has irregularities relatively reduced as compared with the case of the granular substances stacked.

Further, as a result of earnest research, the present inventors have found that the surface irregularities fall within the acceptable range in terms of the following aspect ratio (indicated by the mean length/mean thickness) in the present embodiment. More specifically, the aspect ratio is 20 or more, and more preferably 40 or more in the case of the mean length of 0.5 μm or more and 5.0 μm or less and the mean thickness of 5 nm or more and 100 nm or less. More particularly, the aspect ratio is preferably 40 or more in the case of the mean length of 0.5 µm or more and 1.5 µm or less and the mean thickness of 5 nm or more and 30 nm or less.

More specifically, the increased aspect ratio means that the degree of flatness is furthermore increased. As a result, thin scale-shaped filmy fines are provided. The application of the metallic pigment ink using the fines makes it more likely that the scale-shaped filmy fines contained in the metallic pigment ink are arranged in a planar form in a relatively orderly manner. In other words, a smooth state is provided with relatively little surface irregularities. As a result, the diffused reflection of incident light is reduced to make it possible to exhibit abundant metallic luster. In addition, because of the flatness, a vast extent of space will not be produced uselessly even when the scale-shaped filmy fines are overlapped with each other. More specifically, the scale-shaped metal fines arranged densely are conceived to be more likely to be overlapped with each other.

In this way, the measurement was made actually for the printing surface with the metallic pigment ink using the dispersion containing the aluminum fines of 20 or more in aspect ratio. According to the results, the 20° specular gloss was greater than 150, whereas the 60° specular gloss was greater than 250. In addition, in the case of the aspect ratio of 40 or more, likewise as described above, the 20° specular gloss was greater than 200, whereas the 60° specular gloss was greater than 300.

The dispersion according to the present embodiment has a configuration to contain the scale-shaped filmy fines (the scale-shaped aluminum fines in the present embodiment) described above in the solvent. Continuously, the dispersion will be described.

The solvent constituting the dispersion to be used in the present embodiment is supposed to be the same as the solvent for the metallic pigment ink. The same solvent has the advantage that the dispersion can be easily applied to the metallic pigment ink.

For the metallic pigment ink, an organic solvent is primarily used. This is because favorable weather resistance is achieved due to the use of organic solvent. Accordingly, the metallic pigment ink can be used in a favorable manner even for large-size advertisements, signboards, signs, etc. in outdoor applications. However, in the case of conventional organic solvents such as, for example, toluene and xylene, the use of the solvents imposes heavy burdens on the human body and environment. Therefore, it is important to use an organic solvent for avoiding such burdens, or reducing any burden on the human body and environment as much as possible Therefore, a glycol ether-based solvent and a lactone-based solvent alone, or a mixture thereof are used for the ink composition in the present embodiment.

The use of the organic solvent for the purpose of reducing the burdens on the human body and environment reduces the solvent odor typically to a negligible degree. In addition, the dispersion according to the present embodiment can be made friendly to the user and the surrounding environment for use, as compared with conventional organic solvents.

Furthermore, a minute amount of resin used for a release layer (hereinafter, also referred to as a "release resin") is preferably attached to the aluminum fines. The attachment of the release resin makes it much more likely that the aluminum fines are dispersed to be present in the dispersion. More specifically, in the coexisting environment of the release resin with the glycol ether-based solvent and the lactone-based solvent alone, or a mixture thereof as the organic solvent, the release resin has a property of being likely to be dispersed. Thus, the aluminum fines with the release resin attached thereto is also more likely to be dispersed in the organic solvent, that is, the glycol ether-based solvent and the lactone-based solvent alone, or a mixture thereof.

The dispersion according to the present embodiment has been described above. Next, a method for producing this dispersion will be described.

The dispersion according to the present embodiment is obtained through the following production steps, that is: a laminated body production step of obtaining a laminated body by stacking, on a surface of a polymer resin film as a base material film, a release layer of resin, and a filmy layer obtained by vapor depositing or sputtering any one or more of a simple metal, an alloy, and a metal compound in this order; a filmy layer separation step of obtaining a thin film by separating the filmy layer from the laminated body while using a solvent which is able to dissolve the resin; a fine grinding step of finely grinding the thin film existing in the solvent; and a concentration adjustment step of adjusting the solid content concentration of the finely ground thin film in the solvent after the fine grinding step.

In the present embodiment herein, aluminum is used. Therefore, a description will be given with an aluminum layer as the filmy layer and aluminum foil as the thin film.

First, the laminated body production step will be described.

The polymer resin film for use as a base material is not limited particularly, and conventionally known polymer resin films can be used. More specifically, any polymer resin film may be adopted as long as the film is widely used in the production of laminated body. The polymer resin film may be, for example, a polyethylene terephthalate (PET) film, a polypropylene film, or a polyamide film, etc. However, a PET film is particularly used in the present embodiment. This is because the PET film can be considered as an easily handled film in many ways since the PET film has been widely used conventionally.

It is noted that the base material film is not limited to the PET film in the present embodiment. For example, a polymer resin film which also has resistance to the solvent which can dissolve a release layer described later may be used as the base material film. In this case, the base material film will not be dissolved or damaged by the solvent, even through the aluminum layer separation step described later. Therefore, this case makes it possible to use the polymer resin film again as a base material film. More specifically, the polymer resin film can be used as a recyclable base material film. Thus, it is noted that it is also possible to make the polymer resin film preferable.

The release layer is stacked on the surface of the PET film. This release layer has to be easily dissolved in a specific solvent in the aluminum layer separation step described later. The thickness of the release layer is not limited particularly, as long as the release layer has a thickness that allows the leases layer to be dissolved in a specific solvent as described later. However, it may be sufficient that the content of the resin constituting the release layer in the scale-shaped filmy fines dispersion is finally 5 wt % or less of the scale-shaped filmy fines dispersion.

In the present embodiment, this release layer may be composed of, for example, any of polyvinyl alcohol, polyvinyl butyral, polyethylene glycol, polyacrylic acids, polyacrylamide, cellulose derivatives, acrylic acid copolymers or modified nylon resins, cellulose acetate butyrate, etc. In this embodiment, the release layer is composed of cellulose acetate butyrate (CAB). The reason that a minute amount of CAB is attached to the aluminum fines described above is that the CAB is used in this step. The reason that the CAB is used in this step will be described later. This CAB is stacked on the surface of the PET film by a so-called known wet coating method (for example, a gravure coating method). More specifically, while conveying the PET film in a roll to roll manner, the CAB is stacked on the PET film by a gravure coating method in the process. This achieves the PET film with the CAB stacked thereon.

After stacking the release layer on the surface of the PET film in this way, aluminum is then vapor deposited further on the surface of the release layer to stack an aluminum layer. In the present embodiment, the aluminum layer may be stacked by a conventionally known method (for example, a vacuum deposition method or a sputtering method). In addition, the aluminum layer desirably has a thickness of 5 nm or more and 100 nm or less. However, this thickness is as described previously. Further, this thickness is directly the thickness of the scale-shaped aluminum fines in the present embodiment. The thickness of the aluminum layer is adjusted to 20 nm in the present embodiment. It is noted that when this thickness is to be adjusted to less than 5 nm, the vapor deposited film obtained will be discontinuous. Therefore, it is not possible to obtain aluminum fines which have the specific shape in the present embodiment. Furthermore, when the thickness of the aluminum layer is adjusted to less than 5 nm, the vapor deposited film itself fails to achieve metallic luster. Therefore, the mean thickness of the aluminum layer is adjusted to 5 nm or more in the present embodiment.

It is noted that it is conceivable that this vapor deposition is also carried out in the same way as described previously onto the surface of the CAB of the PET film/CAB in the form of an elongated film while conveying the film in a roll to roll manner. Thus, the vapor deposition is also carried out in such a way in the present embodiment.

The laminated body composed of PET film/CAB/aluminum is obtained in the way described above. It is noted that the stacking on one side of the PET film has been described in the present embodiment. However, the stacking may be carried out in an equivalent manner onto both sides of the PET film. In addition, it is noted that the stacking may be repeatedly carried out onto one side, or the stacking may be repeatedly carried out onto both sides. More specifically, the aluminum/CAB/PET film/CAB/aluminum may be adopted. Alternatively, the PET film/CAB/aluminum/CAB/aluminum/ (hereinafter, repeated) . . . may be adopted. Alternatively, the . . . /aluminum/CAB/PET film/CAB/aluminum/CAB . . . may be adopted.

Next, the aluminum layer separation step will be described.

After the production of the laminated body, this step separates the aluminum layer from the laminated body. In the present embodiment, a solvent which is able to easily dissolve the release layer is used to carry out this step.

There are various known approaches for the method of dissolving the release layer in the solvent to separate the aluminum layer. For example, the following method is conceivable.

First, in the case of the laminated body in the form of a so-called elongated film, the laminated body in the form of the elongated film is continuously conveyed in a roll to roll manner. During this conveyance, the solvent is sprayed onto the entire laminated body. Next, the aluminum layer is scraped away from the laminated body with the solvent sprayed thereon. More specifically, the aluminum layer is removed from the base material film. Then, the scraped aluminum layer is collected. However, the sprayed solvent in this case may be attached onto the aluminum layer as it is. In addition, the section with the release layer already dissolved by the solvent before the scraping and thus the aluminum layer separated and detached from the base material film is also expected to be produced. Thus, it can be considered optimum that, as a whole, the aluminum layer is collected with the whole solvent from the stage which carries out the operation of spraying the solvent.

More specifically, this aluminum layer separation step is carried out to collect not only the separated aluminum layer, but also the solvent to be used in separation together with the aluminum layer.

Furthermore, actually, the release layer is not dissolved completely. More specifically, the aluminum layer with a portion of the release layer still attached thereto will come to be collected at the same time. However, such collection may be adopted in the present embodiment. More specifically, a minute amount of CAB is attached to the aluminum layer in the present embodiment. The reason that the attachment is allowed will be described later.

It is preferable to use, as the solvent for dissolving the release layer as describes above, for example, any of a glycol ether-based solvent or a lactone-based solvent, or a mixture thereof in the present embodiment.

Moreover, preferred examples of the glycol ether include aliphatic of methyl, n-propyl, i-propyl, n-butyl, i-butyl, hexyl, and 2-ethylhexyl, as well as ethylene glycol-based ethers and propylene glycol-based ethers which have each of allyl and phenyl groups having a double bond as a base group. Further specifically, preferred examples thereof include ethylene glycol monomethyl ether, ethylene glycol monoethyl ether, ethylene glycol monoisopropyl ether, ethylene glycol monobutyl ether, ethylene glycol monohexyl ether, ethylene glycol monophenyl ether, diethylene glycol monomethyl ether, diethylene glycol monoethyl ether, diethylene glycol monobutyl ether, diethylene glycol dimethyl ether, diethylene glycol diethyl ether, triethylene glycol monomethyl ether, triethylene glycol monoethyl ether, triethylene glycol monobutyl ether, propylene glycol monomethyl ether, propylene glycol monoethyl ether, dipropylene glycol monomethyl ether, and dipropylene glycol monoethyl ether. Incidentally, these examples are colorless, and give out a little odor. Furthermore, these examples have an ether group and a hydroxyl group in their molecules. Therefore, these examples have properties as both alcohols and ethers, and are liquid at room temperature.

In addition, preferred examples of the lactone include γ-butyrolactone, δ-butyrolactone, and ε-butyrolactone.

Further, the use of diethylene glycol diethyl ether (hereinafter, referred to as DEGdEE) or γ-butyrolactone is preferred in the present embodiment. In addition, DEGdEE is used as the solvent in the present embodiment. As described previously, the DEGdEE can be considered preferable also in terms of the use as an organic solvent which imposes smaller burdens on the human body and environment.

The aluminum layer separation step is carried out in the way described above. This step collects the aluminum layer as aluminum foil along with the DEGdEE. More specifically, the aluminum foil partially with the CAB attached thereto is collected, which is dispersed in the solvent of DEGdEE.

In this way, the dispersion is obtained which contains the aluminum foil in the DEGdEE. Next, the fine grinding step is carried out for finely grinding the aluminum foil existing in the dispersion as much as possible. Then, a concentrating step is carried out for adjusting the solid content (that is, the concentration) of the finely ground aluminum fines in the DEGdEE solvent.

Thus, next, these steps will be described.

The method to be used in the fine grinding step is not limited particularly, and conventionally well-known approaches may be adopted for the method.

In this fine grinding step, the aluminum foil is finely ground and turned into fines without carrying out an operation of taking the aluminum foil from the DEGdEE solvent by filtration. As a result, the dispersion subjected to the fine grinding step contains the DEGdEE solvent as it is. In addition, the aluminum foil is present as aluminum fines of desired size in the DEGdEE solvent. The aluminum fines in this case individually has a substantially scale shape, that is, has a planar shape. This is because the aluminum fines are obtained by grinding the aluminum foil stacked on the base material film as a flat surface. In addition, the mean length of the aluminum fines (that is, the mean value of the maximum lengths from end to end at the surfaces of the obtained fines) is desirably 0.5 µm or more and 5.0 µm or less. In addition, the maximum length of the aluminum fines (the maximum among the maximum lengths from end to end at the surfaces of the fines) is desirably 10 µm or less. Further, the thickness is adjusted to the thickness in the stacking as described previously. Therefore, the mean thickness of the aluminum fines obtained by the separation is 5 nm or more and 100 nm or less in the present embodiment.

Then, after the completion of the fine grinding step, the concentration adjustment step is carried out. More specifically, this step finally adjusts the ratio (that is, the solid content) of the aluminum fines existing in the DEGdEE solvent. No particularly special approach is used for this concentration adjustment step. More specifically, the DEGdEE solvent may be prepared so as to provide a desired concentration as a result in the present embodiment. For example, it is also conceivable that the DEGdEE solvent is evaporated to concentrate the dispersion, or it is also conceivable that a treatment is carried out adding the DEGdEE solvent to lower the concentration.

It is noted that the fine grinding step is carried out after carrying out the aluminum layer separation step as described above. However, in order to carry out the fine grinding step more smoothly, a first preliminary grinding step may be carried out as a step of grinding the separated aluminum foil preliminary. Thus, this step will be described.

There may be cases where it is effective for the aluminum foil subjected to the aluminum layer separation step to be subjected to grinding in two steps, rather than finely ground at once. More specifically, the aluminum foil is ground to a certain degree of size. Then, the foil is further finely ground separately in another step.

In other words, the actual approach in the first preliminary grinding step is not necessarily limited particularly. It may be sufficient that the original aluminum foil is ground to a certain degree.

In addition, for carrying out the fine grinding step finally, there may be also cases where a certain degree of dispersion concentration is ensured, depending on the finely grinding method. More specifically, for example, between the case of grinding with the solvent on the order of about 1% and the case of grinding with the solvent on the order of about 20%, a difference is produced in the quality of the finally obtained dispersion. In the present embodiment, the aluminum foil obtained originally after the aluminum layer separation step is present in the DEGdEE solvent used for dissolving the CAB as the release layer. However, typically, this state fails to a desired concentration in many cases. More specifically, when the DEGdEE is used in large amounts, the DEGdEE solvent containing the obtained aluminum foil has an excessively low concentration. Therefore, it is conceivable that it is not possible to carry out desired fine grinding efficiently when the solvent is directly used in the fine grinding step. Thus, in order to deal with this situation, it is preferable to carry out the concentrating step of adjusting the concentration, after carrying out the first preliminary grinding step. In fact, when the first preliminary grinding step is carried out, the aluminum foil is ground to a certain degree of size. However, because of the excessively low concentration, only a dispersion is obtained which is not considered so suitable to be used in the final fine grinding step. Therefore, it is effective to increase the concentration in the concentrating step.

In the case of making a transition to the fine grinding step through the first preliminary grinding step and the concentrating step, the ground state may not have been fully prepared yet in some cases. More specifically, when it is determined that the ground state is not ready yet for carrying out fine grinding, it is effective to further carry out a second preliminary grinding step.

Incidentally, conventionally known approaches may be adopted for the individually described first preliminary grinding step and second preliminary grinding step, as in the case of the fine grinding step. Furthermore, all of the grinding approaches may be the same approach in the respective steps of the first preliminary grinding step, second preliminary grinding step, and fine grinding step. Alternatively, these approaches may be all different approaches. Alternatively, any two of the steps may adopt the same approach, whereas the other step may adopt a different approach. In short, any approach may be adopted as long as aluminum fines of desired size are obtained finally in the fine grinding step. Therefore, when any preliminary preparation is required for that purpose, the first preliminary grinding step and the concentrating step, and further the second preliminary grinding step may be carried out.

The dispersion according to the present embodiment will be obtained in this way.

The obtained dispersion will be further described.

As described preciously, the dispersion according to the present embodiment uses DEGdEE as the solvent. This is because this selection can easily dissolve the CAB. More specifically, there is no difference between the substance for use as the solvent for dissolving the CAB and the solvent to be used in the dispersion. Thus, the need to carry out extra treatments is eliminated to make the workability preferable. However, the CAB is not dissolved completely in the aluminum layer separation step. The CAB even in minute amounts is attached to the aluminum fines. More specifically, some of the aluminum fines have nothing attached thereto, whereas some have the CAB attached thereto.

Further, the present inventors have confirmed the following. More specifically, when the aluminum fines in this state are present in the DEGdEE solvent, some of the fines are likely to settle out in the DEGdEE solvent although the detailed mechanism is not known exactly. On the other hand, some of the fines float in the solvent for a long period of time.

Specifically, the combination of the DEGdEE with CAB makes the aluminum fines with the CAB attached thereto less likely to settle out. On the other hand, the aluminum fines with no CAB attached thereto settle out in a normal way. Thus, as a result, the aluminum fines are conceived to continue to be dispersed relatively in the solvent in the dispersion. It is noted that the DEGdEE is used in the present embodiment. However, it is noted that the same phenomenon is observed even when γ-butyrolactone is used.

In addition, the release layer has been described previously. The release layer can be used so that the content in the case of the dispersion obtained by the approach as described so far is 5 wt % or less of the dispersion. In this case, the present inventors have found that the dispersibility of the scale-shaped filmy fines is very good.

Likewise, the thickness of the aluminum layer is adjusted to 5 nm or more and 100 nm or less. This is because the thickness of more than 100 nm causes the following problem, even when the CAB is attached to some of the scale-shaped aluminum fines. More specifically, it has been confirmed that the weight of the scale-shaped aluminum fines themselves fails to cause the phenomenon described above, or makes the phenomenon less likely to be caused. In addition, the thickness of less than 5 nm makes the obtained scale-shaped aluminum fines themselves excessively thin. Thus, a phenomenon of being likely to cause agglomeration has been confirmed. Obviously, the other reasons for the metallic luster, etc. are as described already.

The dispersion obtained in the way described above may be used as some of raw materials for various products. Specifically, in the case of desiring a metallic pigment ink, fines of metal foil are simply mixed in an ink in a conventional case. In this case, the unevenly distributed fines of the metal foil fail to achieve a sufficient metallic effect. On the other hand, in the case of mixing the dispersion according to the present embodiment in the ink, the scale-shaped filmy fines are more likely to be dispersed in the ink in more preferable balance. Therefore, a metallic pigment ink is obtained which is likely to achieve metallic luster as a result. In addition, if the ink is used as, for example, an ink for an ink-jet printer, the scale-shaped filmy fines will be dispersed in the ink in a preferred manner as described previously. Therefore, prints printed by the printer also evenly achieve the effect, without unevenly distributed metallic luster. Moreover, the scale-shaped filmy fines will not be unevenly distributed or agglomerated in the ink. Therefore, a trouble will not be caused, such that the scale-shaped filmy fines themselves or agglomerates thereof block holes of nozzles. Preferred scale-shaped filmy fines are obtained.

EXAMPLE

A case will be investigated below in which the dispersion according to the present invention was actually used as a raw material for a metallic pigment ink for an ink-jet printer.

Ink-jet printer used: SP-300V manufactured by Roland D G Corporation

Printing media used: SVG-610G manufactured by Roland D G Corporation

Metal to be used in scale-shaped filmy fines: Aluminum 1.5 wt %

Solvents to be used in dispersion:
Diethylene glycol diethyl ether 61 wt %
γ-butyrolactone 15 wt %
Tetraethylene glycol dimethyl ether 18 wt %
Binder resin: Cellulose acetate butyrate 4 wt %
Dispersant: non-ionic surfactant 0.5 wt %

How to make metallic pigment ink for ink-jet printer: The scale-shaped filmy fines dispersion, solvent, binder resin, and dispersant were adjusted as described above, and adjusted in a mill or an agitator so as to provide ink properties.

The dispersant was used for a metallic pigment ink. The obtained metallic pigment ink was subjected to test printing by an ink-jet printer so as to provide an area of 10 cm×10 cm.

The test printing was carried out onto an A4 lustrous vinyl chloride sheet.

Then, the 20° specular gloss and 60° specular gloss at the printing surface were measured in accordance with the JIS_Z_8741 standards.

Seven types of examples and four types of comparative example were produced for comparative reviews.

The results are shown in a table.

TABLE 1

| | Mean thickness (nm) | Mean length (μm) | Aspect ratio | Specular gloss 20° | Specular gloss 60° | Printing stability |
|---|---|---|---|---|---|---|
| Example 1 | 20 | 1 | 50 | 220 | 373 | Good |
| Example 2 | 8 | 0.8 | 100 | 235 | 390 | Good |
| Example 3 | 30 | 1.4 | 47 | 212 | 367 | Good |
| Example 4 | 48 | 2.3 | 48 | 202 | 340 | Good |
| Example 5 | 70 | 2.4 | 34 | 164 | 284 | Good |
| Example 6 | 91 | 2.3 | 25 | 158 | 265 | Good |
| Example 7 | 20 | 4.5 | 225 | 195 | 327 | Good |
| Comparative Example 1 | 19 | 6 | 316 | 181 | 296 | NA |
| Comparative Example 2 | 108 | 2.8 | 26 | 132 | 254 | Partially NA |
| Comparative Example 3 | 70 | 1.2 | 17 | 131 | 237 | Good |
| Comparative Example 4 | Commercially available pigment ink used (*) | | | 82 | 112 | Good |

(*) Gray printing

As described above, the examples, that is, the cases of using the dispersions according to the present invention were capable of carrying out printing exhibiting a desired degree of luster. However, the comparative examples failed to carry out printing in the first place in some cases, and also failed to achieve sufficiency in terms of degree of luster. In addition, in particular, the aspect ratio greater than 40 generally achieved a high degree of luster.

The scale-shaped filmy fines dispersion according to the present invention is used to produce a metallic pigment ink. This metallic pigment ink is used for an ink-jet printer for printing. Thus, prints can be obtained which are favorable in terms of metallic luster and impressive.

This international application claims the priority based on Japanese Patent Application No. 2009-199457 filed on Aug. 31, 2009. The content of Japanese Patent Application No. 2009-199457 is entirely incorporated herein by reference.

The specific embodiments of the present invention have been described by way of example. The descriptions are not to be intended to be exhaustive, or limit the present invention to the embodiments described as they are. It is obvious to one skilled in the art that a large number of changes and modifications can be made in view of the descriptions.

The invention claimed is:

1. A scale-shaped filmy fines dispersion to be used in a metallic pigment ink for an ink-jet printer, comprising, in a solvent, scale-shaped filmy fines obtained by finely grinding a simple metal, an alloy, or a metal compound, wherein:

when one scale-shaped filmy fine among the scale-shaped filmy fines is observed in a substantially planar view and, with respect to the longest length value among lengths of the scale-shaped filmy fine from end to end, the mean value of the length values of all the scale-shaped filmy fines is regarded as a mean length, and when one scale-shaped filmy fine among the scale-shaped filmy fines is observed in a substantially side view and, with respect to the thickness value of the scale-shaped filmy fine, the mean value of the thickness values of all the scale-shaped filmy fines is regarded as a mean thickness, wherein the mean length is 0.5 μm or more and 5.0 μm or less, a maximum length is 10 μm or less when the maximum among the length values is regarded as the maximum length, and the mean thickness is at least 5 nm and is less than 15 nm.

2. The scale-shaped filmy fines dispersion according to claim 1, wherein
an aspect ratio represented by the mean length/mean thickness is 20 or more.

3. The scale-shaped filmy fines dispersion according to claim 2, wherein
when the metallic pigment ink for an ink-jet printer prepared by using the scale-shaped filmy fines dispersion is printed on a lustrous vinyl chloride sheet, the metallic luster of a printing surface obtained by the printing is 150 or more for 20° specular gloss and 250 or more for 60° specular gloss when measured in accordance with JIS_Z_8741 standards.

4. The scale-shaped filmy fines dispersion according to claim 1, wherein
an aspect ratio represented by the mean length/mean thickness is 40 or more.

5. The scale-shaped filmy fines dispersion according to claim 4, wherein
when the metallic pigment ink for an ink-jet printer prepared by using the scale-shaped filmy fines dispersion is printed on a lustrous vinyl chloride sheet, the metallic luster of a printing surface obtained by the printing is 200 or more for 20° specular gloss and 330 or more for 60° specular gloss when measured in accordance with JIS_Z_8741 standards.

6. The scale-shaped filmy fines dispersion according to claim 4, wherein
the mean length is 0.5 μm or more and 1.5 μm or less.

7. The scale-shaped filmy fines dispersion according to claim 1, wherein
the simple metal, alloy, or metal compound is any one or more from the group of metals consisting of aluminum, silver, gold, nickel, chromium, tin, zinc, indium, titanium, silicon, copper, and platinum; or alloys using the group of metals; or any one or more of oxides, nitrides, sulfides, and carbides of the group of metals or alloys thereof.

8. The scale-shaped filmy fines dispersion according to claim 1, wherein
the solvent is an organic solvent.

9. The scale-shaped filmy fines dispersion according to claim 8, wherein
the organic solvent is either a glycol ether-based organic solvent or a lactone-based organic solvent, or a mixture thereof.

10. The scale-shaped filmy fines dispersion according to claim 1, wherein
the scale-shaped filmy fines is obtained through
a laminated body production step of obtaining a laminated body by stacking, on a surface of a polymer resin film as a base material film,
a release layer of resin, and
a filmy layer obtained by vapor depositing or sputtering any one or more of a metal element, an alloy, and a metal compound in this order;
a filmy layer separation step of obtaining a thin film by separating the filmy layer from the laminated body while using a solvent which is able to dissolve the resin; and
a fine grinding step of finely grinding the thin film existing in the solvent.

11. The scale-shaped filmy fines dispersion according to claim 10, wherein
a concentration adjustment step of adjusting the solid content concentration of the finely ground thin film in the solvent after the fine grinding step.

12. The scale-shaped filmy fines dispersion according to claim 10, wherein
the content of the resin in the scale-shaped filmy fines dispersion is 5 wt % or less of the scale-shaped filmy fines dispersion.

13. The scale-shaped filmy fines dispersion according to claim 10, wherein
the resin is soluble in the solvent.

14. The scale-shaped filmy fines dispersion according to claim 10, wherein
the resin is any one of cellulose acetate butyrate, polyvinyl alcohol, polyethylene glycol, polyacrylic acids, polyacrylamide, cellulose derivatives, polyvinyl butyral, acrylic acid copolymers and modified nylon resins.

15. The scale-shaped filmy fines dispersion according to claim 1, wherein the mean particle thickness is between 5 nm and 8 nm, inclusive.

16. A scale-shaped filmy fines dispersion of a metallic pigment ink for an ink-jet printer, comprising:
scale-shaped filmy fines comprised of a simple metal, an alloy, or a metal compound in a solvent, and having a particle size distribution in which
mean particle length is 0.5 μm or more and 1.5 μm or less,
maximum particle length is 5 μm or less, and
mean particle thickness is 5 nm or more to less than 15 nm; and
wherein an aspect ratio of the mean particle length/mean particle thickness is at least 40.

* * * * *